United States Patent [19]
Hayashihara

[11] Patent Number: 5,517,689
[45] Date of Patent: May 14, 1996

[54] PHASE DETECTING METHOD AND PHASE DETECTOR AND FM RECEIVER USING PHASE DETECTING METHOD

[75] Inventor: Mikio Hayashihara, Atsugi, Japan

[73] Assignee: Kabushiki Kaisha Toshiba, Kawasaki, Japan

[21] Appl. No.: 87,062

[22] Filed: Jul. 7, 1993

[30] Foreign Application Priority Data

Jul. 8, 1992 [JP] Japan ..................................... 4-181290
May 14, 1993 [JP] Japan ..................................... 5-113162

[51] Int. Cl.$^6$ .................................................. H04B 1/16
[52] U.S. Cl. ..................... 455/205; 455/209; 455/214; 329/306; 329/343
[58] Field of Search ..................... 455/209, 210, 455/211, 214, 205; 375/80, 82, 86, 324, 325; 329/306, 343, 341, 307, 310; 307/231

[56] References Cited

U.S. PATENT DOCUMENTS

| | | | |
|---|---|---|---|
| 4,675,882 | 6/1987 | Lille et al. | 329/341 X |
| 5,301,210 | 4/1994 | Vandamme et al. | 329/306 |
| 5,315,618 | 5/1994 | Yoshida | 329/307 |

*Primary Examiner*—Reinhard J. Eisenzopf
*Assistant Examiner*—Philip J. Sobutka
*Attorney, Agent, or Firm*—Banner & Allegretti, Ltd.

[57] ABSTRACT

A phase detection system in which an original modulation signal is detected from a first complex baseband signal obtained through orthogonal demodulation of an FM signal and output, a second complex baseband signal having cosine and sine components of a phase change $\Delta\phi$ of the first complex baseband signal in a predetermined time interval $\tau$ is rotated until a rotation angle $\theta$ becomes $\Delta\phi$, and rotation angle data indicative of the rotation angle $\iota$ is detected and output.

13 Claims, 16 Drawing Sheets

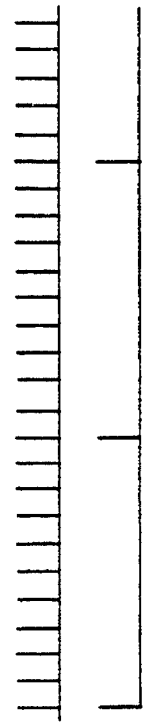
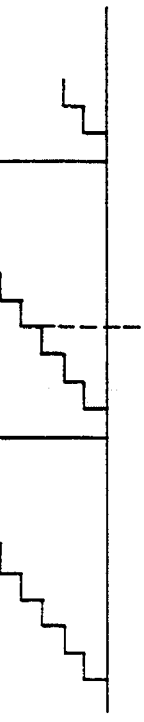
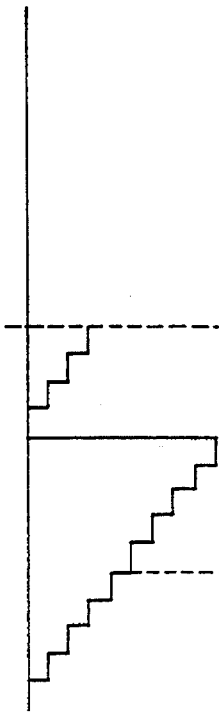
FIG.7(a) CLOCK PULSE P₄
FIG.7(b) SAMPLING PULSE P₁
FIG.7(c) OUTPUT OF COUNTER 161
FIG.7(d) OUTPUT OF COUNTER 162
FIG.7(e) SAMPLING PULSE P₂
FIG.7(f) SAMPLING PULSE P₃
FIG.7(g) OUTPUT OF HOLD CIRCUIT (OUTPUT OF ANGLE DATA GENERATION CIRCUIT)

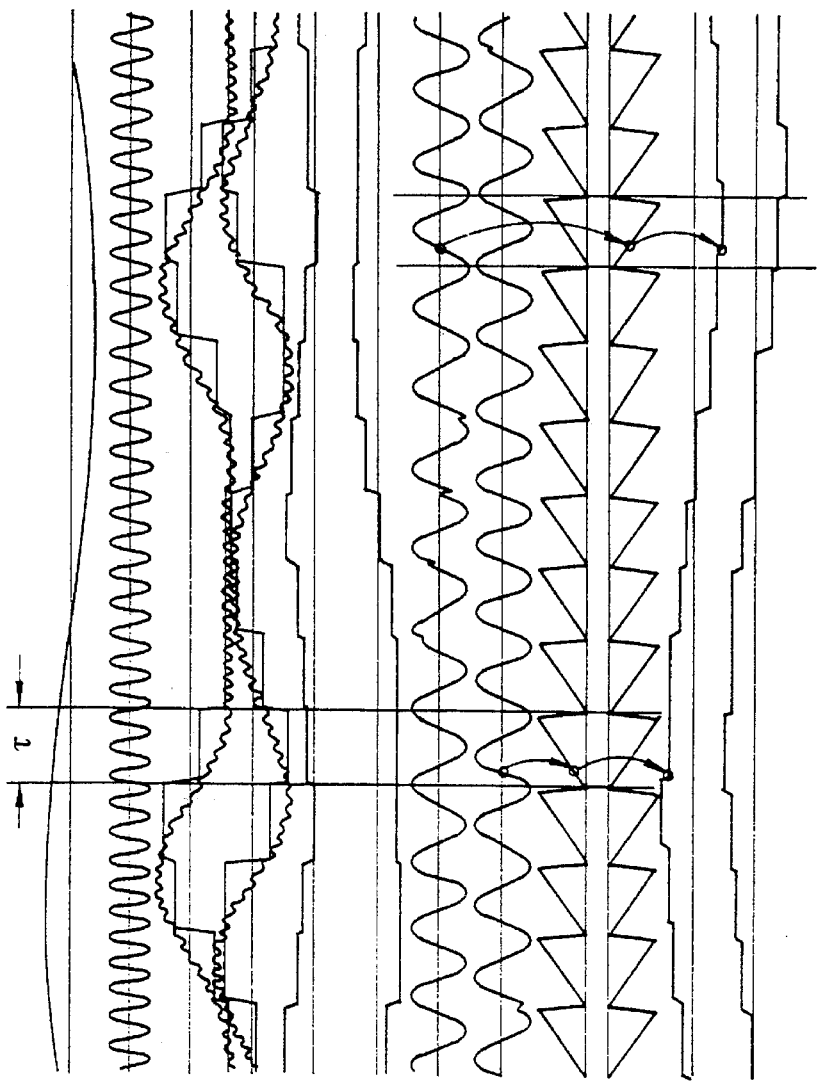

5,517,689

PHASE DETECTING METHOD AND PHASE DETECTOR AND FM RECEIVER USING PHASE DETECTING METHOD

BACKGROUND OF THE INVENTION

1. Field of the Invention

The present invention relates to a phase detector which is used in a frequency-modulation receiver (FM receiver) of a type wherein an original modulation signal is detected from a complex baseband signal generated through orthogonal demodulation of a frequency modulated signal (FM signal), and more particularly, to an improvement of a phase detection method for detecting an original modulation signal independent of the amplitude of the received signal and a phase detector and an FM receiver to which the phase detection method is applied.

2. Description of the Related Art

In conventional FM receivers, there is a type in which an original modulation signal is detected from a complex baseband signal generated through orthogonal demodulation of an FM signal. In this type, the center frequency of the FM signal is equal to the local frequency. Compared with a superheterodyne receiver (another type of the conventional FM receivers), the first-mentioned type has various advantages which includes the following.

a. An image suppressing filter is unnecessary.

b. A baseband filter which determines a channel selectivity can be formed in an integrated circuit (IC).

c. A detection circuit can be formed in an IC since signal detection is performed in the baseband signal.

Incidentally, the orthogonal demodulation may be carried out directly at a reception frequency (direct conversion reception method) or may be carried out at an intermediate frequency by lowering the reception frequency. Mobile communication apparatus such as a radio telephone set can be made small and light by employing the direct conversion reception method.

FIG. 17 shows an example of an FM receiver of this type. An FM signal $R\cos(\omega_c t + \phi)$ (where $$\phi(t) = \int^t m(t)dt,$$

m(t): modulation signal) supplied to an input terminal 101 is sent to mixers 102 and 103 where it is subjected to orthogonal demodulation with use of local signals $\cos \omega_c t$ and $-\sin \omega_c t$ having an angular frequency $\omega_c$ equal to the intermediate frequency, and then sent to low-pass filters 104, 105 and amplifiers 106, 107 to generate complex baseband signal components $I(t)=(R/2)\cos\phi(t)$ and $Q(t)=(R/2)\sin\phi(t)$, respectively.

The baseband signal component I is differentiated at a differentiator 108 and multiplied by the baseband signal component Q at a mixer 111, while the baseband signal component Q is differentiated at a differentiator 109 and multiplied by the baseband signal component I at a mixer 110. A subtractor 112 subtracts the output of the mixer 111 from the output of the mixer 110 to obtain the modulation signal m(t). The above processes are expressed as follows.

$(R/2)\{\phi(t)\}'\cos\phi(t) \cdot (R/2)\cos\phi(t)$
$- [-(R/2)\{\phi(t)\}'\sin\phi(t)]\left(R\dfrac{}{2}\right)\sin\phi(t)$
$= (R^2/4)\{\phi(t)\}'$
$= (R^2/4)\,m(t)$ However, the signal thus detected includes a coefficient $(R^2/4)$ whose value is proportional to the square of the amplitude R of the received signal. As a result, the detected signal may fluctuates according to the fluctuation in the amplitude of the received signal caused by fading or the like.

Accordingly, in the example of FIG. 17, the complex baseband signal components I and Q are squared at mixers 113 and 114 and then added together at an adder 115 to generate a signal corresponding to the coefficient $(R^2/4)$. The coefficient signal is supplied to a divider 116 to divide the above detection output $(R^2/4)m(t)$ so as to obtain a normalized output m(t). The normalized output is sent via a low-pass filter 117 to an output terminal 118.

Typically, the outputs of the amplifiers 106 and 107 are converted at A/D converters (not shown) into digital values for digital signal processing (DSP) in the subsequent stages. This is advantageous because digital type differentiators 108, 109, multipliers 110, 111, 113, 114, subtractor 112, adder 115, etc can be operated with higher accuracy compared with those of analog type. Further, this is advantageous because signals in other modulation methods can be detected with the same hardware configuration if software is changed.

For the dividing operation performed at the divider 116, four dividing methods are known, i.e., reciprocal ROM method, logarithm calculation method, subtraction shift method and convergence division method (Refer to "Signal Processor and its Applications", Shoukou-dou, by Rikio Maruta and Takao Nishiya, pp.38–41). However, a dividing method capable of performing dividing operation with satisfactory high accuracy and speed has not been developed. The absence of satisfactory dividing method is a serious obstacle which has prevented an FM receiver of this type requiring a division circuit from being developed.

Conventional FM receivers of this type cannot absorb the fluctuations in the detection output caused by fluctuations in the amplitude of the FM signal, thus making it difficult to implement an FM receiver having a high signal reception accuracy.

SUMMARY OF THE INVENTION

Accordingly, an object of the present invention is to provide a phase detecting method capable of eliminating the amplitude fluctuation in an input signal without performing dividing operation to thereby maintain a high signal reception accuracy in an FM receiver.

Another object of the present invention is to provide a phase detector for an FM receiver capable of eliminating the amplitude fluctuation in an input signal without performing dividing operation to thereby reduce the size and power consumption of the FM receiver.

Still another object of the present invention is to provide an FM receiver of high signal reception accuracy, reduced size and power consumption by using a phase detecting method capable of eliminating the amplitude fluctuation in an input signal without performing dividing operation.

To achieve one or more of the above objects, according to the first aspect of the present invention, there is provided a method of detecting an instantaneous phase in a complex baseband signal, comprising the steps of performing phase rotation to the baseband signal; generating rotation-angle data indicative of a rotation angle of the baseband signal; rotating the phase of the baseband signal so as to equalize with phase of the baseband signal to be obtained; and outputting the rotation-angle data indicative of the rotation angle thus equalized.

According to the second aspect of the present invention, there is provided a method of detecting an instantaneous phase in a complex baseband signal, comprising a phase region detection step of detecting one of a plurality of phase regions formed by equally dividing a complex coordinate plane by $2\pi/N$ radian (N being an integer of 4 or more) to which a phase of the complex baseband signal belongs and outputting a detected result as a coarse phase value; a rotation projection step of rotating the phase of the baseband signal by $+\pi/N$ or $-\pi/N$ radian according to a designation signal having a value of 1 or 0 indicative of an increase or decrease tendency in the phase of the baseband signal and outputting a value obtained by projecting the phase-rotated baseband signal onto a straight line which is perpendicular to a center axis bisecting the detected phase region and which has an origin at its intersection point whose positive direction corresponds to phase increasing direction in the detected phase region; an integration step of integrating the value obtained by the projection; a quantization step of converting the integrated value into a 1-bit binary value; a delay step of transmitting the 1-bit binary value with a predetermined delay; a synthesizing step of synthesizing the coarse phase value with the binay value; and a filtering step of filtering the synthesized value, wherein the phase of the baseband signal is detected utilizing $\Sigma\text{-}\Delta$ modulation.

According to the third aspect of the present invention, there is provided a phase detector for detecting an instantaneous phase in a complex baseband signal, comprising phase rotation means for rotating a phase of the baseband signal; rotation-angle data generation means for generating rotation-angle data indicative of the phase angle to be rotated in the baseband signal; and phase/rotation-angle equalization means for rotating the phase of the baseband signal so as to equalize with phase of the baseband signal to be obtained, wherein an output of the rotation-angle data generation means indicative of a rotation angle made equal by the phase/rotation-angle equalization means is output as a detection signal.

According to the fourth aspect of the present invention, there is provided a phase detector for detecting an instantaneous phase in a complex baseband signal, comprising phase region detection means for detecting one of a plurality of phase regions formed by equally dividing a complex coordinate plane by $2\pi/N$ radian (N being an integer of 4 or more) to which a phase of the complex baseband signal belongs and outputting a detected result as a coarse phase value; rotation projection means for rotating the phase of the baseband signal by $+\pi/N$ or $-\pi/N$ radian according to a designation signal having a value of 1 or 0 indicative of an increase or decrease tendency in the, phase of the baseband signal and outputting a value obtained by projecting the phase-rotated baseband signal onto a straight line which is perpendicular to a center axis bisecting the detected phase region and which has an origin at its intersection point whose positive direction corresponds to phase increasing direction in the detected phase region; integration means for integrating an output of the rotation projection means; quantization means for converting an output of the integration means to 1-bit binary value; delay means for delaying an output of the quantization means to obtain a delayed signal and outputting the delayed signal as the designation signal; phase synthesizing means for synthesizing the coarse phase value output of the phase region detection means with the output of the quantization means; and filter means for filtering an output of the phase synthesizing means, wherein the phase of the baseband signal is detected utilizing $\Sigma\text{-}\Delta$ modulation.

Preferably, in the phase detector, the integer N is 4 so that the complex coordinate plane is divided into four quadrants in a complex coordinate system by axes I and Q corresponding to phase components I and Q of the baseband signal, and the output of the rotation projection means is determined according to which quadrant the baseband signal belongs to and value of the 1-bit binary value transmitted with delay as follows:

(A) When the baseband signal is in the first quadrant, the output is Q when the 1-bit binary value is "0", and $-I$ when the output of the delay step is "1";

(B) When the baseband signal is in the second quadrant, the output is $-I$ when the 1-bit binary value is "0", and $-Q$ when the 1-bit binary value is "1";

(C) When the baseband signal is in the third quadrant, the output is $-Q$ when the 1-bit binary value is "0", and I when the 1-bit binary value is "1";

(D) When the baseband signal is in the fourth quadrant, the output is I when the 1-bit binary value is "0", and Q when the 1-bit binary value is "1".

According to the fifth aspect of the present invention, there is provided an FM receiver in which an FM signal is subjected to orthogonal demodulation with use of a orthogonal local signal having a frequency equal to a center frequency of the FM signal to obtain a demodulated first complex baseband signal so as to detect an original modulation signal with use of the demodulated first complex baseband signal, the FM receiver comprising second complex baseband signal generation means for generating a second complex baseband signal having cosine and sine components of a phase change of the first complex baseband signal in a predetermined time interval $\tau$; phase rotation means for rotating a phase of the second complex baseband signal; rotation-angle data generation means for generating data indicative of the phase angle to be rotated; and phase/rotation-angle equalization means for equalizing a rotation angle of the rotated second complex baseband signal to the phase change of the first complex baseband signal during the time interval $\tau$, wherein an output of the rotation-angle data generation means indicative of the rotation angle equalized by the phase/rotation-angle equalization means is taken as a detection output.

According to the sixth aspect of the present invention, there is provided an FM receiver in which an FM signal is subjected to orthogonal demodulation with use of a orthogonal local signal having a frequency equal to a center frequency of the FM signal to obtain a demodulated first complex baseband signal so as to detect an original modulation signal with use of the demodulated first complex baseband signal, the FM receiver comprising second complex baseband signal generation means for generating a second complex baseband signal having cosine and sine components of a phase change of the first complex baseband signal in a predetermined time interval $\tau$; phase region detection means for detecting one of a plurality of phase regions formed by equally dividing a complex coordinate plane by $2\pi/N$ radian (N being an integer of 4 or more) to which a phase of the second complex baseband signal belongs and outputting a detected result as a coarse phase value; rotation projection means for rotating the phase of the baseband signal by $+\pi/N$ or $-\pi/N$ radian according to a designation signal having a value of 1 or 0 indicative of an increase or decrease tendency in the phase of the baseband signal and outputting a value obtained by projecting the phase-rotated baseband signal onto a straight line which is perpendicular to a center axis bisecting the detected phase region and which has an origin at its intersection point whose positive direction corresponds to phase increasing direction in the detected phase region; integration means for integrating an output of the rotation projection means; quantization means for converting an output of the integration means to 1-bit binary value; delay means for delaying an output of the quantization means to obtain a delayed signal and outputting the delayed signal as the designation signal; phase synthesizing means for synthesizing the coarse phase value output of the phase region detection means with the output of the quantization means; and filter means for filtering an output of the phase synthesizing means, wherein the phase of the baseband signal is detected utilizing $\Sigma$-$\Delta$ modulation.

In an FM receiver according to the present invention, the first complex baseband signal components $I=(R/2) \cos\phi(t)$, $Q=(R/2) \sin\phi(t)$ generated through orthogonal demodulation of an FM signal are sampled at a predetermined time interval $\tau$ to obtain $(R/2) \cos\phi n$ and $(R/2) \sin\phi n$. Also, $(R/2) \cos\phi n-1$ and $(R/2) \sin\phi n-1$ at one sample time before are obtained. From these signals, phase change $\Delta\phi n=\phi n-\phi n-1$ during the time $\tau$ is obtained from which cosine and sine components $(R^2/4) \cos\Delta\phi n$, $(R^2/4) \sin\Delta\phi n$ is generated. The second complex baseband signal constituted by these cosine and sine components are phase rotated so that its rotation angle becomes equal to the $\Delta\phi n$. The rotation angle is recognized by means of angle data generation means and the recognized $\Delta\phi n$ is output as a detected signal.

In the FM receiver, a modulation signal $\{\phi(t)\}'=m(t)$ is detected by rotating the complex baseband signal components $(R^2/4) \cos\Delta\phi n$, $(R^2/4) \sin\Delta\phi n$ (where $\Delta\phi$ being a phase change during the time $\tau$) until the rotation angle $\theta$ becomes equal to $\Delta\phi$ and by recognizing the rotation angle $\theta$ with use of the separately-prepared rotation-angle data generation means. Since the phase change $\Delta\phi$ during the time $\tau$, i.e., $\Delta\phi/\tau \approx \{\phi(t)\}'=m(t)$ is detected, the original modulation signal can be detected independently of the amplitude of the reception signal.

In a phase detector according to the present invention, in detecting the phase $\phi(t)$ from the input complex baseband signal components $\cos \phi(t)$ and $\sin \phi(t)$, the phase region detection means detects one of a plurality of phase regions which are formed by equally dividing the complex coordinate plane by $2\pi/N$ radian (N being an integer of 4 or more) to which a phase of an input complex baseband signal belongs. The detected phase region is output as a coarse phase value.

Along with the above operation, the input complex baseband signal is input to the rotation projection means so that the input complex baseband signal is rotated by $+\pi/N$ or $-\pi/N$ radian according to the binary output signal "0" or "1" of the delay means and the rotated signal is projected on a line which is perpendicular to a center axis bisecting the phase region detected in the phase region detection means and which has an intersection point as an origin and a positive direction corresponding to the phase increasing direction of the phase region.

Further, an output of the rotation projection means is integrated by the integration means, an output of the integration means is subjected to binary quantization by the quantization means, an output of the quantization means is delayed by the delay means and supplied to the rotation projection means, the output of the quantization means is synthesized with the coarse phase value output from the phase region detection means and then is output through the filter means.

In the phase detector, a closed loop made up of the rotation projection means, integration means, quantization means and delay means forms a $\Sigma$-$\Delta$ modulator which converts the phase information of the input complex baseband signal into the density information of the output binary signal. As a result, the phase detection accuracy depends not on the phase rotation accuracy but on the time axis. As a result, since the rotation phase is fixed at $\pm\pi/N$ radian, the phase rotation can be constructed only by the linear arithmetic operation of fixed coefficients of the components I and Q of the input complex baseband signal.

Accordingly, the phase detector according to the present invention does not require a ROM having function information written therein and a multiplier operating at a high speed and having a large operation bit numbers. Thus, there can be implemented such an FM receiver which has a phase detector employing the above simple arrangement and is small in size and power consumption.

In particular, when N=4 is selected, the phase region detection means only judges positive or negative sign of the components I and Q of the input complex baseband signal and selects one of the four outputs according to the judgment, and the rotation projection means only selects one of the four signals, i.e., the components I and Q of the input complex baseband signal and generated components $-I$ and $-Q$. As a result, the phase detector has a simpler arrangement.

BRIEF DESCRIPTION OF THE DRAWINGS

FIG. 7(a), 7(b), 7(c), 7(d), 7(e), 7(f), and 7(g) illustrate waveforms of signals appearing at various points in the angle data generation circuit in the FM receiver of FIG. 1;

FIG. 8(a), 8(b), 8(c), 8(d), 8(e), 8(f), 8(g), 8(h), 8(i), 8(j), 8(k), and 8(l) illustrate waveforms of signals of simulation results of detecting operation of the FM receiver of FIG. 1;

DESCRIPTION OF THE PREFERRED EMBODIMENTS

Embodiments of the present invention will be described by referring to the accompanying drawings.

Figure 1:
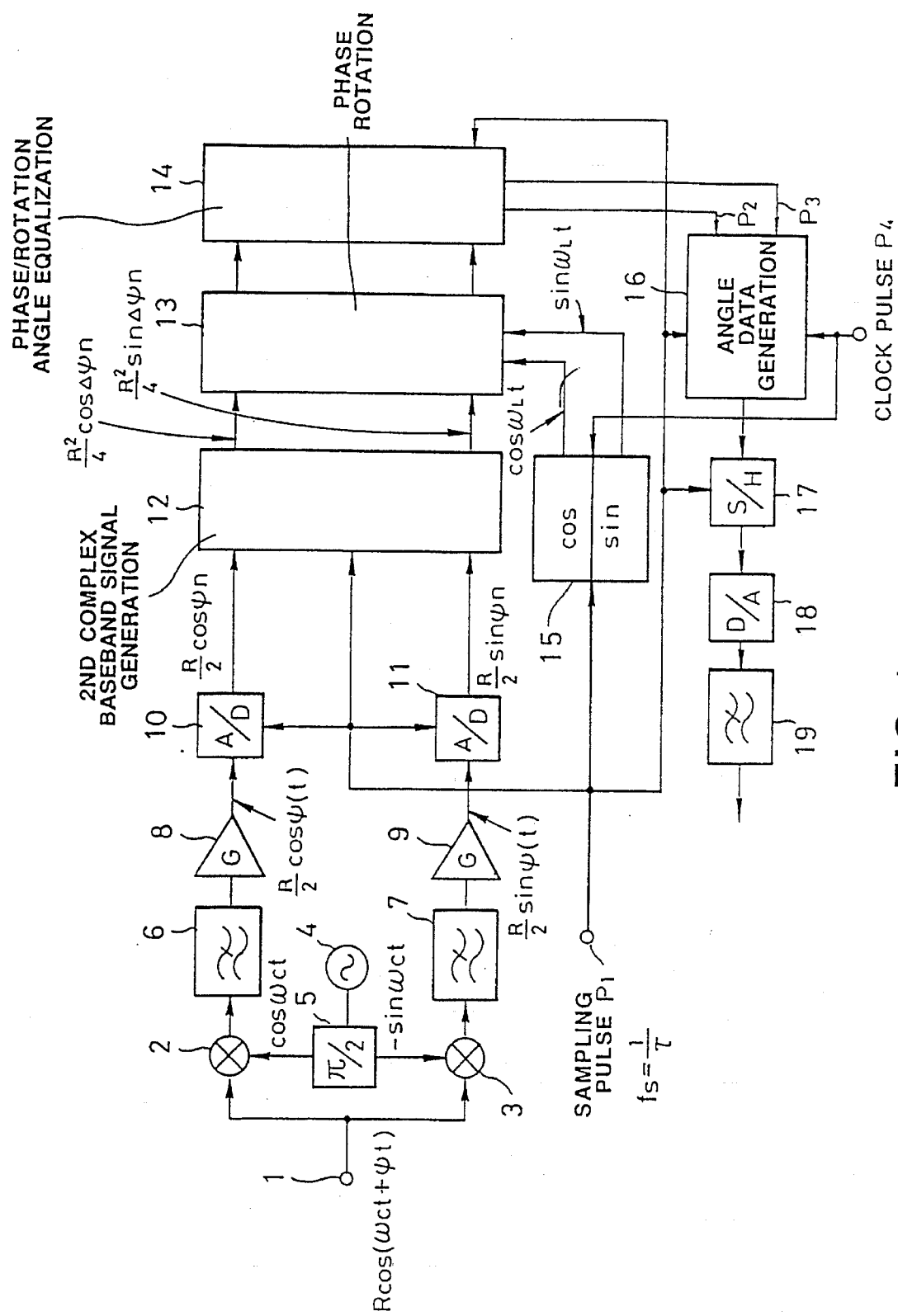
FIG. 1 illustrates an arrangement of an FM receiver using a phase detector in accordance with a first embodiment of the present invention.

FIG. 1 shows an arrangement of an FM receiver which uses a phase detector in accordance with a first embodiment in which the FM receiver comprises mixers 2 and 3, a local oscillator 4, a π/2 phase difference branching filter 5, low-pass filters 6 and 7, amplifiers 8 and 9, A/D converters 10 and 11, a second complex baseband signal generation circuit 12, a phase rotation circuit 13, a phase/rotation equalizing circuit 14, a function memory 15, an angle data generation circuit 16, a sample/hold circuit 17, a D/A converter 18, and a low-pass filter 19.

The FM receiver operates as follows. Referring to FIG. 1, an FM signal $R\cos(\omega_c t+\phi)$ (where $\{\phi(t)\}'=m(t)$, $m(t)$: original modulation signal) supplied to an input terminal 1 is sent to mixers 2 and 3 where the FM signal is subjected to orthogonal demodulation. To the mixers 2 and 3, orthogonal local signals having the same frequency $\omega_c$ are supplied through the local oscillator 4 and the π/2 phase difference branching filter 5.

First complex baseband signal corresponding to the orthogonally-demodulated FM signal whose unnecessary components are removed by the low-pass filters 6 and 7 are amplified by the amplifiers 8 and 9 to a predetermined level, and then converted to digital values at the A/D converters 10 and 11.

The A/D converters 10 and 11 convert the input signal to digital signal by sampling the input signals with a period $\tau$ with use of a sampling pulse P1 having a frequency $f_s=1/\tau$. The digital values are held in the A/D converters 10 and 11 until the A/D converters receive the next sampling pulse.

Figure 2:
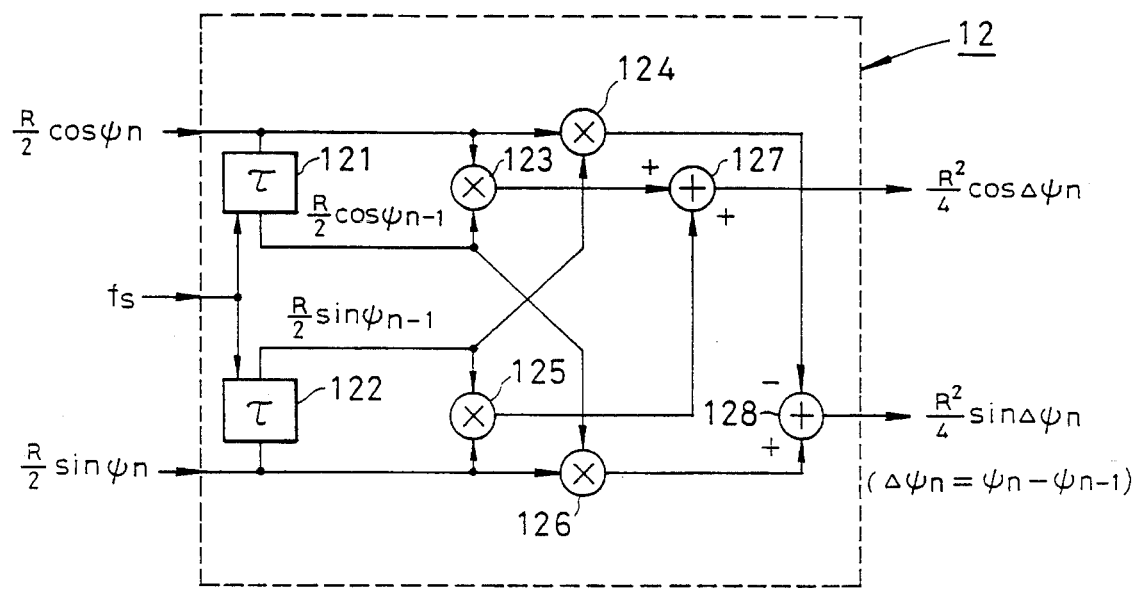
FIG. 2 illustrates a configuration of a second complex baseband signal generation circuit in the FM receiver of FIG. 1.

Outputs of the A/D converters 10 and 11 are supplied to the second complex baseband signal generation circuit 12 which in turn outputs second complex baseband signal including sine and cosine components of a phase $\Delta\phi$ of the first complex baseband signal varying with the sampling intervals $\tau$. The second complex baseband signal generation circuit 12 is constructed, for example, by an arithmetic circuit which has $\tau$ delay circuits 121 and 122, multipliers 123 to 126, an adder 127 and a subtractor 128 as shown in FIG. 2. The second complex baseband signal obtained through the second complex baseband signal generation circuit 12 are as follows.

$$\{(R^2/4)\cos\Delta\phi n, (R^2/4)\sin\Delta\phi n\}$$

In this case, assume that the gains of the mixers 2, 3, filters 6, 7, and amplifiers 8, 9 are set to be all "1", since the gains are not important in this explanation. Then the A/D converters 10 and 11 receive signals $(R/2)\cos\phi(t)$ and $(R/2)\sin\phi(t)$, respectively. Also output signals of the A/D converters 10 and 11 subjected to A/D conversion with the period $\tau$ become $(R/2)\cos\phi n$ and $(R/2)\sin\phi n$ (where, $\phi n=\phi(n\tau)$ and these values correspond to a sample/hold signal held for the period $\tau$).

Outputs of the second complex baseband signal generation circuit 12 are supplied to the phase rotation circuit 13.

Figure 3:
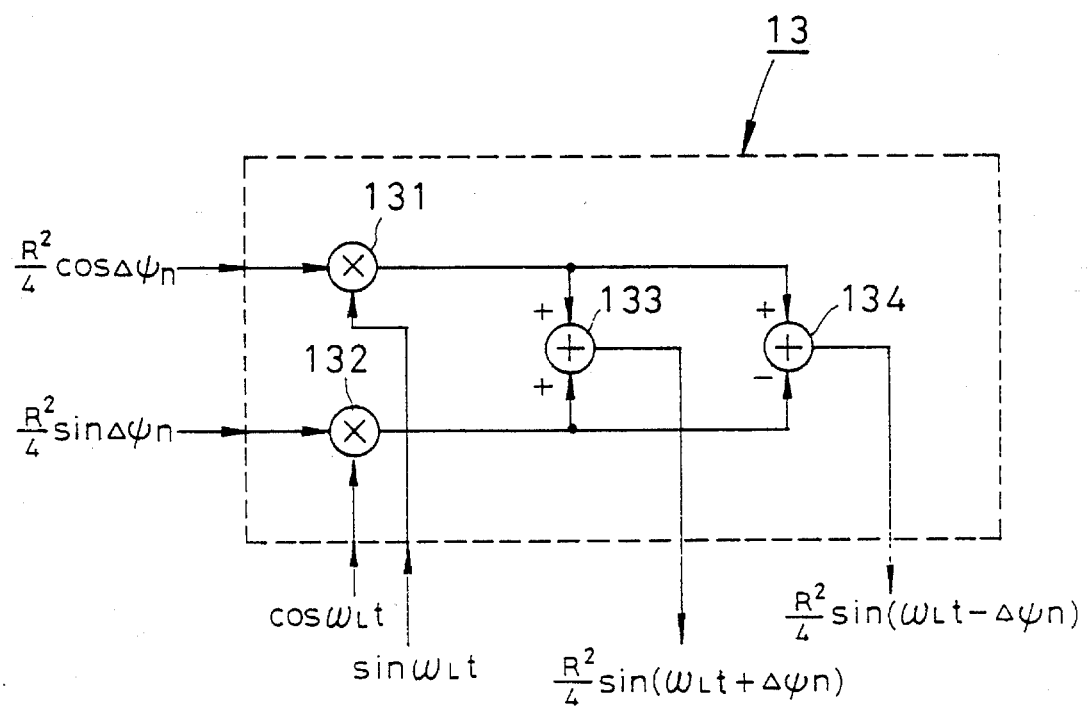
FIG. 3 illustrates a configuration of a phase rotation circuit in the FM receiver of FIG. 1.
Figure 4A:
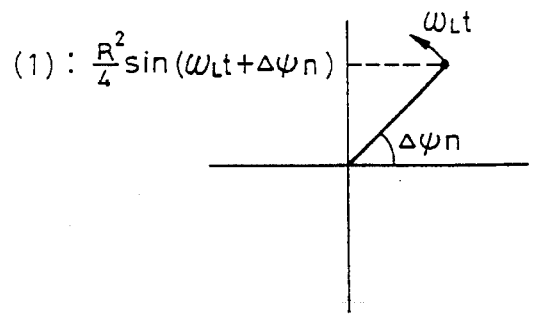
FIG. 4(a), 4(b), 4(c), and 4(d) illustrate coordinate planes for explaining the phase rotation of the FM receiver of FIG. 1.
Figure 4B:
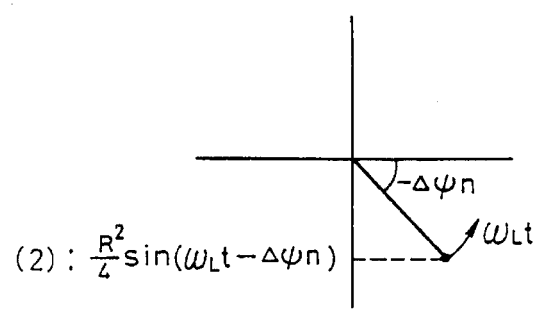
Figure 4C:
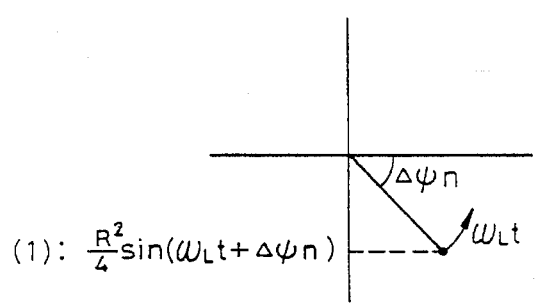
Figure 4D:
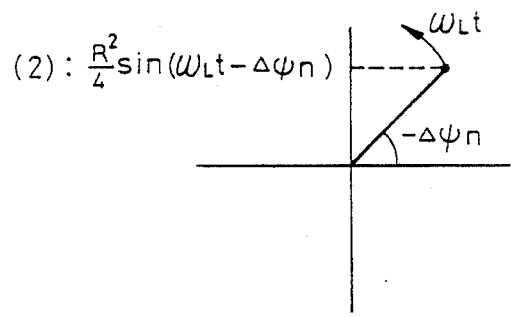

The circuit 13 is constructed, for example, by an arithmetic circuit which has multipliers 131, 132, an adder 133, and a subtractor 134 as shown in FIG. 3.

In the phase rotation circuit 13, the outputs $\{(R^2/4)\cos\Delta\phi n, (R^2/4)\sin\Delta\phi n\}$ of the A/D converters 10 and 11 are multiplied at the multipliers 131 and 132 by orthogonal local signals $\sin\omega_L t$, $\cos\omega_L t$ having a constant angular frequency $\omega_L$ to obtain multiplication results. The multiplication results are then added together and subtracted therebetween at the adder 133 and subtractor 134. As a result, the phase rotation circuit 13 generates outputs that satisfy the following equations (1) and (2).

$(R^2/4)\sin\omega_L t\cos\Delta\phi n+(R^2/4)\cos\omega_L t\sin\Delta\phi n=(R^2/4)\sin(\omega_L t+\Delta\phi n)$ (1)

$(R^2/4)\sin\omega_L t\cos\Delta\phi n-(R^2/4)\cos\omega_L t\sin\Delta\phi n=(R^2/4)\sin(\omega_L t-\Delta\phi n)$ (2)

The equations (1) and (2) both are counterclockwise rotation but have different signs of $\Delta\phi n$. Assuming now that the time interval $\tau$ is sufficiently small so that $\Delta\phi n$ does not exceed ±180 degrees during the period $\tau$, then, with respect to the switching timing of the equations (1) and (2) from negative to positive, the equation (2) is faster when $\Delta\phi n>0$ as shown in FIG. 4(a), 4(b), 4(c), and 4(d) and its rotation angle is equal to $\Delta\phi n$ with a minus sign. That is, the following equation (3) is satisfied where T represents a time at which the equation (1) or (2) switches its negative to positive after the start of the rotation.

$$\omega_L T=-\Delta\phi n \quad (3)$$

Hence, whether the sign of $\Delta\phi n$ is positive or negative can be seen by the fact which equation, (1) or (2), switches faster from negative to positive.

Figure 5:
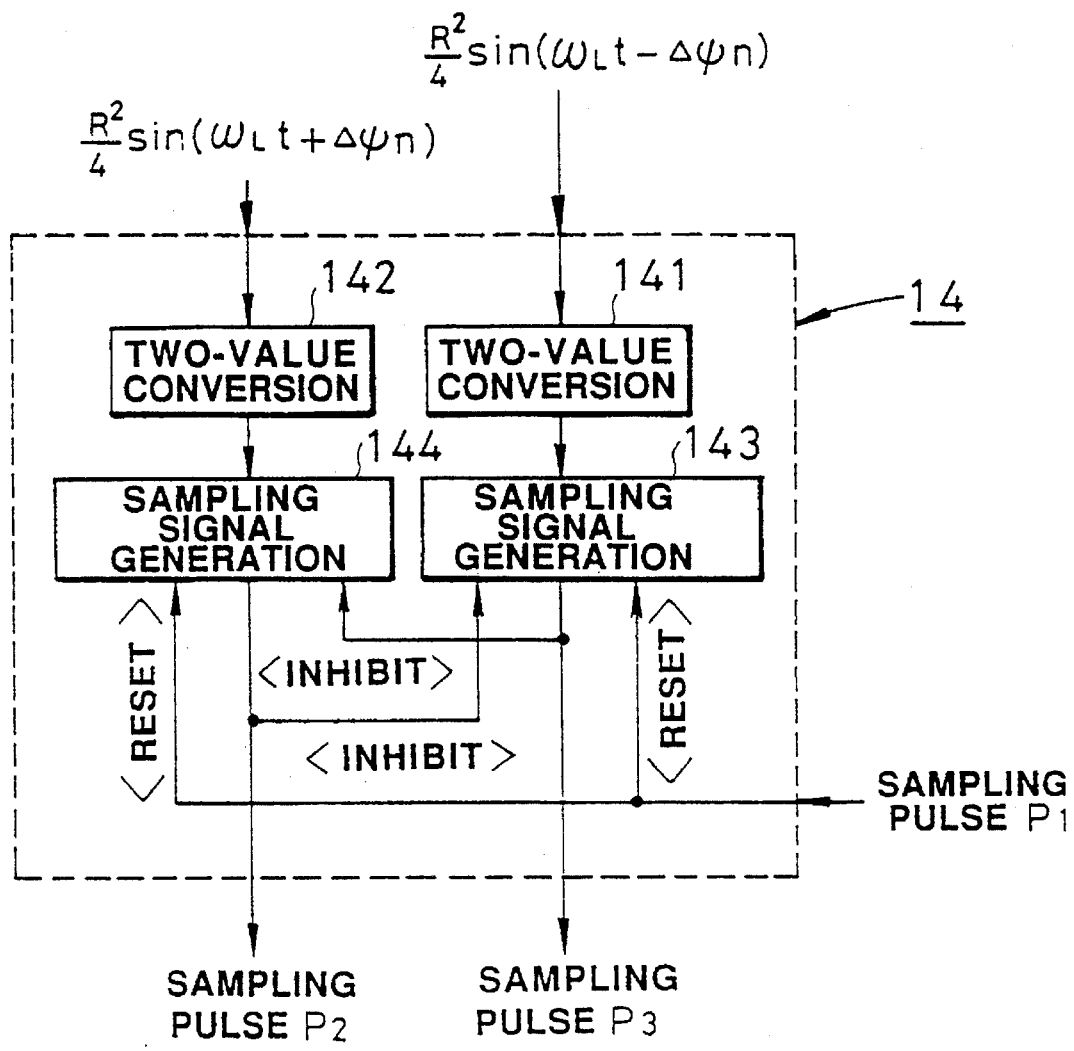
FIG. 5 illustrates a configuration of a phase/rotation angle equalizing circuit in the FM receiver of FIG. 1.

The timing when the rotation angle satisfies the equation (3) and whether $\Delta\phi n$ is positive or negative are detected by the phase/rotation angle equalizing circuit 14. The phase/rotation angle equalizing circuit 14 is constructed, for example, by an arithmetic circuit which has two-value conversion circuits 141, 142 and sampling signal generation circuits 143, 144 as shown in FIG. 5.

In the phase/rotation angle equalizing circuit 14, a zero-cross edge in the signals corresponding to the above equations (1) and (2) is extracted by the two-value conversion circuits 141 and 142. In synchronism with a rising edge, sampling pulse P2 or P3 (FIG. 7, (e) and (f)) is output from the sampling signal generation circuits 143 and 144. The sampling pulses P2 and P3 correspond to the negative and positive signs of $\Delta\phi n$, respectively.

One of the sampling signal generation circuits P2 and P3 which generates the sampling pulse faster, inhibits the generation of the sampling pulse of the other circuit until the sampling pulse P1 (refer to FIG. 7(b)) arrives. In this manner, the positive or negative in the sign of $\Delta\phi n$ is determined.

Figure 6:
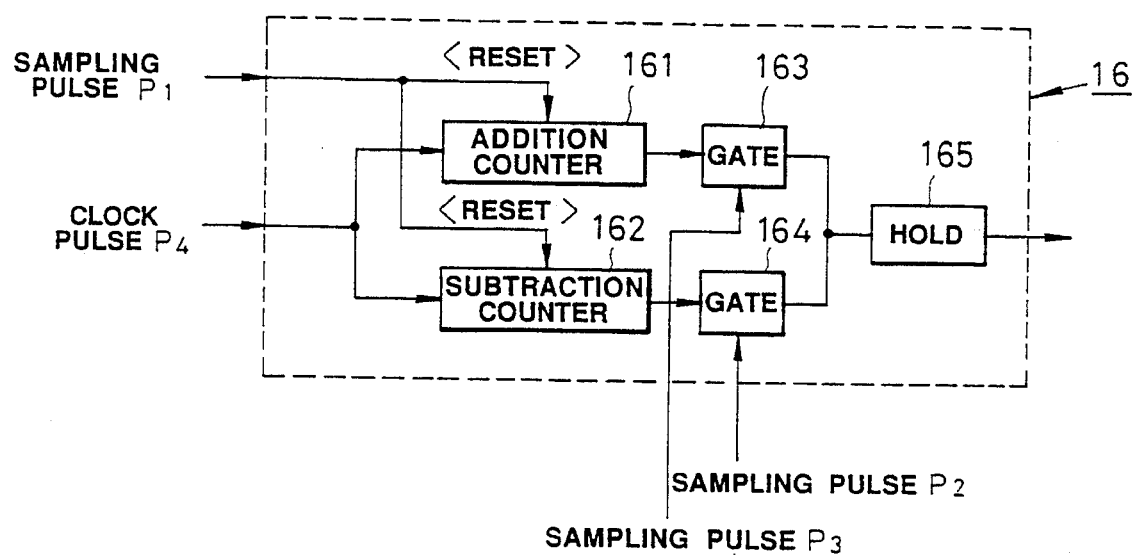
FIG. 6 illustrates a configuration of an angle data generation circuit in the FM receiver of FIG., 1.

The sampling pulse P2 and P3 are supplied to the angle data generation circuit 16 which is constructed, for example, by such an arithmetic circuit as shown in FIG. 6. The angle data generation circuit 16 comprises addition and subtraction counters 161 and 162 which receive a clock pulse P4 (refer to FIG. 7(a), 7(b), 7(c), 7(d), 7(e), 7(f), and 7(g)) having a frequency sufficiently higher than that of the sampling pulse P1 and count up from zero to positive and count down from zero to negative, respectively. These counters 161 and 162 continue to perform their counting operation while they are periodically reset by the sampling pulse P1.

The sampling pulse P2 opens an output gate 164 of the subtraction counter 162, while the sampling pulse P3 opens an output gate 163 of the addition counter 161, whereby outputs of the gates are transmitted to a hold circuit 165. The hold circuit 165 holds its value until one of the gates (163 or 164) is opened to renew the value.

Shown collectively in FIG. 7(a), 7(b), 7(c), 7(d), 7(e), 7(f), and 7(g) is a timing chart of signals associated with the operation of the angle data generation circuit 16. In the drawing, outputs (FIG. 7, (c) and (d)) of the addition and subtraction counters 161 and 162 correspond to the rotation angle of the phase rotation circuit 13. Accordingly, an output (FIG. 7(g)) of the angle data generation circuit 16 represents $\Delta \phi n$ in the period $\tau$, i.e., $\Delta \phi n/\tau \approx \{\phi(t)\}' = m(t)$.

The output of the angle data generation circuit 16 is sampled and held again by the sample/hold circuit 17 in synchronism with the sampling pulse P1. This is required to eliminate the jitter which occurs due to the fact that the sampling time at the output of the angle data generation circuit 16 is not completely periodical. A resultant signal having now a complete sample/hold waveform is converted at the D/A converter 18 into an analog signal, which is further smoothed at the low-pass filter 19, and then output therefrom.

In this embodiment, orthogonal local signals $\sin\omega Lt$ and $\cos\omega Lt$ to be given to the phase rotation circuit 13 are stored in the function memory (ROM) 15 which is reset or started by the sampling pulse P1. Since reading of the function memory is carried our by the clock pulse P4, the count value of the angle data generation circuit 16 corresponds to the rotation angle output from the phase rotation circuit 13.

FIG. 8(a), 8(b), 8(c), 8(d), 8(f), 8(g), 8(h), 8(i), 8(j), 8(k), and 8(l) illustrate computer simulation results of waveforms of signals appearing at various points in the above FM receiver. In the drawing, (a) shows the original modulation signal m(t), (b) shows $\cos(\omega ct + \phi(t))$ $$\left(\text{where } \phi(t) = \int^t m(t)dt\right)$$

which is obtained by the frequency modulation with respect to m(t) to $\cos\omega ct$.

FIGS. 8 (c) and (d) show $\cos\phi(t)$ and $\sin\phi(t)$ which are derived from orthogonal demodulation and passing through the low-pass filters and signals $\cos\phi n$ and $\sin\phi n$ which are obtained by sampling and holding of $\cos\phi(t)$ and $\sin\phi(t)$, respectively in which these two signals are superimposed with each other.

FIGS. 8 (e) and (f) show $\cos\Delta\phi n$ and $\sin\Delta\phi n$ ($\Delta\phi n = \Delta n - \Delta n - 1$) which are obtained through the arithmetic operation of the second complex baseband signal generation circuit 12 of FIG. 2. FIGS. 8 (g) and (h) show signals $\sin(\omega Lt + \Delta\phi n)$ and $\cos(\omega Lt + \Delta\phi n)$ which are obtained through the arithmetic operation of the phase rotation circuit 13 of FIG. 3. FIGS. 8 (i) and (j) show the outputs of the addition and subtraction counters obtained through the arithmetic operation of the angle data generation circuit 16 of FIG. 6.

Sampling is performed for signal (j) when the signal (g) is switched from negative to positive faster than the signal (h) whereas the sampling is performed for signal (i) when the signal (h) is switched from negative to positive faster than the signal (g). The sampled and held signal corresponds to a signal (k). At this stage, the signal (k) approximately reproduces the original modulation signal (FIG. 8(a)).

Since the sampling interval varies, the signal (k) is again sampled with the interval $\tau$ to obtain a signal (l). In practical applications, the signal (a) can be completely reproduced by passing the signal (l) through a smoothing filter.

Now, a phase detector is described which does not require a ROM for storing cosine and sine functions and a high-speed multiplier having a large operation bit number. The phase detector employs a phase detection method system which utilizes $\Sigma$–$\Delta$ modulation. By this phase detector, an FM receiver can be made small in size and low in power consumption.

Figure 9:
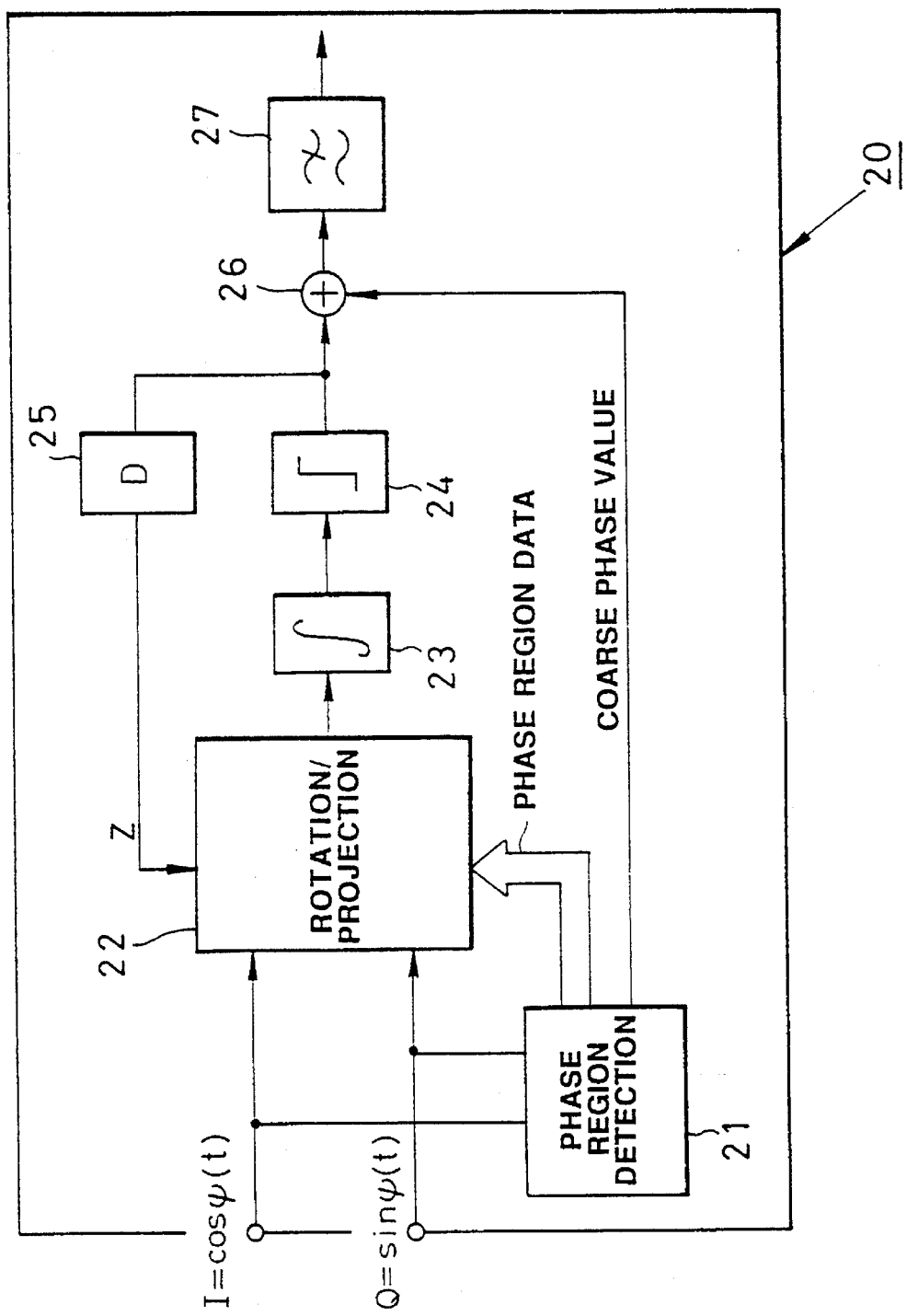
FIG. 9 illustrates a configuration of a phase detector in accordance with a second embodiment of the present invention.

FIG. 9 shows a basic arrangement of a phase detector according to the second embodiment to which the phase detection method based on the $\Sigma$–$\Delta$ modulation is employed. The phase detector comprises a phase region detection circuit 21, a rotation projection circuit 22, an integration circuit 23, a quantization circuit 24, a delay circuit 25, a phase synthesizing circuit 26 and a filter 27. The phase detector may be used in the FM receiver of FIG. 1 for receiving and detecting the second complex baseband signal obtained from the second complex baseband signal generation circuit 12.

The phase region detection circuit 21 detects which one of a plurality of phase regions previously equally divided by every $2\pi/N$ radian (N being an integer of 4 or more) the phase of the input complex baseband signal belongs to, and outputs the detection result as a coarse phase value.

The rotation projection circuit 22 rotates the input complex baseband signal by $+\pi/N$ radian or $-\pi/N$ radian according to a binary signal of "0" or "1" issued from the delay circuit 25, and outputs a value obtained by projecting the rotated complex baseband signal onto a straight line which is perpendicular to a center axis bisecting the phase region detected by the phase region detection circuit 21 and which has an origin at its intersection point and whose positive direction corresponds to phase increasing direction in the phase region.

Output of the rotation projection circuit 22 is subjected at the integration circuit 23 to integration, subjected at the quantization circuit 24 to binary quantization, subjected at the phase synthesizing circuit 26 to addition to the coarse phase value received from the phase region detection circuit 21, and then output through the filter 27. In the illustrated example, an output of the quantization circuit 24 is delayed by the delay circuit 25 and then supplied to the rotation projection circuit 22.

In the phase detector, a closed loop constituted by the rotation projection circuit 22, integration circuit 23, quantization circuit 24 and delay circuit 25 forms a $\Sigma$–$\Delta$ modulator which converts the phase information of the input complex baseband signal into the density information of the output binary signal.

The provision of the $\Sigma$–$\Delta$ modulator in the second embodiment enables the phase detection accuracy to be found not in the form of phase rotating accuracy but on the time axis. Thus, since the rotation phase can be fixed at $\pm\pi/N$ radian, the phase rotation can be realized only through linear arithmetic operation of fixed coefficients of the components I and Q of the input complex baseband signal.

The operation of the phase detector in accordance with the second embodiment will be explained in detail in connection with the case where the phase division number N is selected to be 4. When N=4 is selected, as will be understood by the following explanation, all that the phase region detection circuit 21 has to do is to judge whether the sign of the components I and Q of the input complex baseband signal is positive or negative and to select one of four outputs based on the judgment while all that the rotation projection circuit 22 has to do is to select one of the four signals comprising the components I and Q of the input complex baseband signal and the components –I and –Q. As a result, the phase detector can be implemented with a simpler arrangement.

Figure 10:
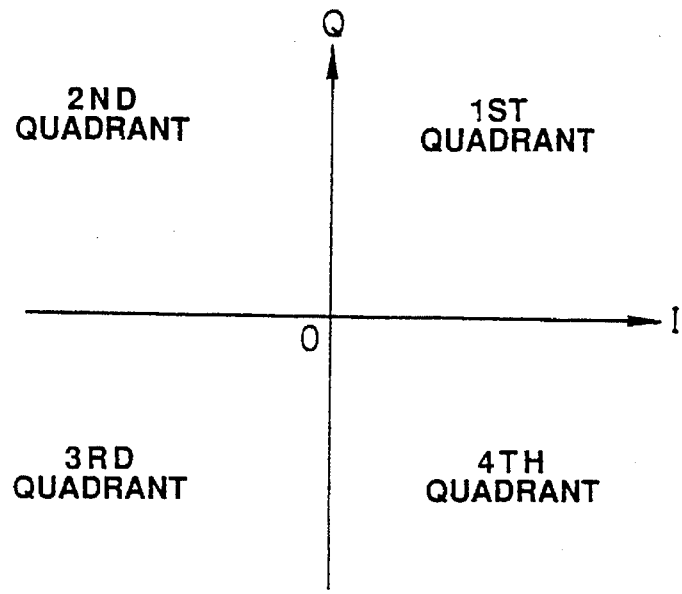
FIG. 10(a) and 10(b) illustrate diagrams for explaining phase region division states of the phase detector of FIG. 9.
Figure 10:
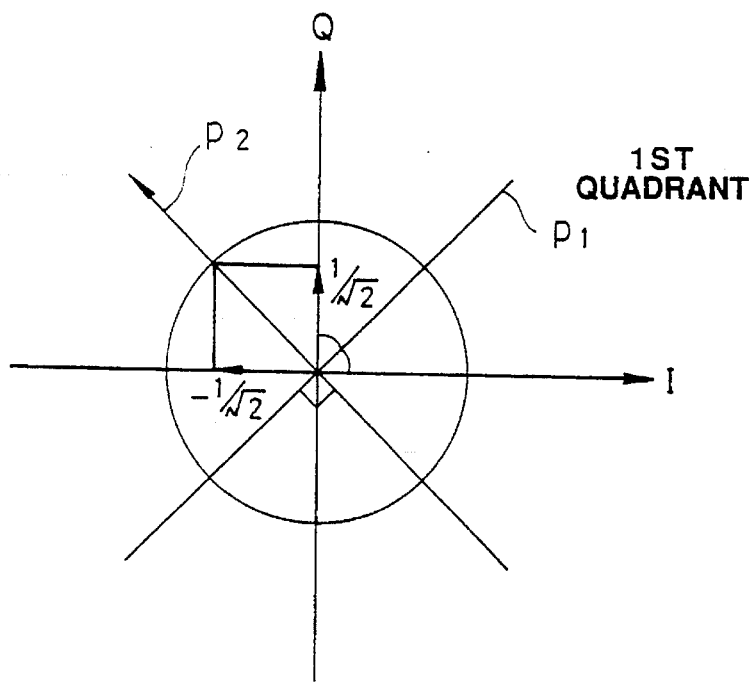

When N=4 is selected, the phase region detection circuit 21 detects one of phase regions of first to fourth quadrants defined by axes I and Q as shown in FIG. 10(a) and which includes the input signal, and outputs a coarse phase value corresponding to the detected quadrant.

Figure 11:
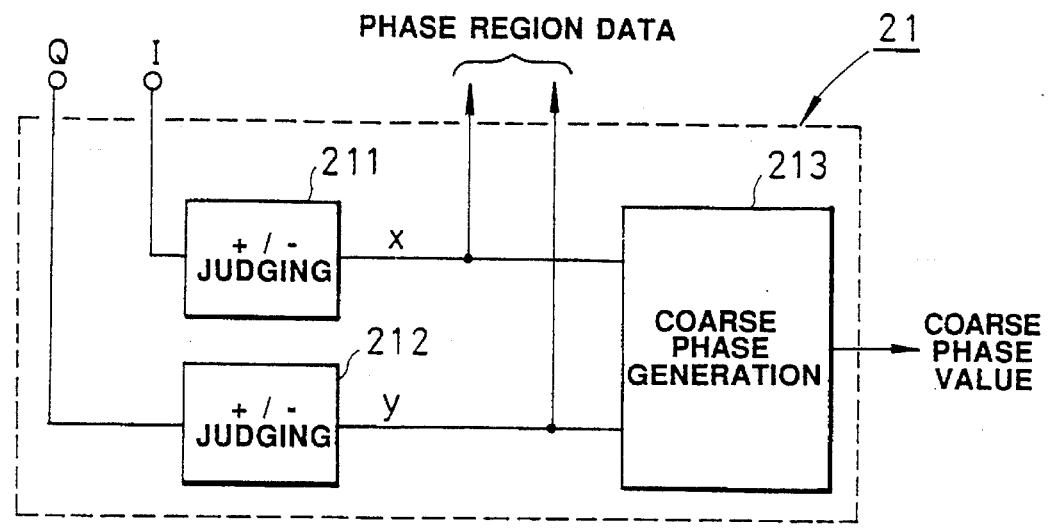
FIG. 11 illustrates a configuration of a phase region detection circuit in the phase detector of FIG. 9.

Shown in FIG. 11 is an example of the phase region detection circuit 21, in which outputs x and y of positive/ negative judgment circuits 211 and 212 have both "1" when the inputs I and Q are positive and "0" when the inputs I and Q are negative. The outputs x and y are supplied as branched to the rotation projection circuit 22 and also to the coarse phase generation circuit 213.

Figure 12:
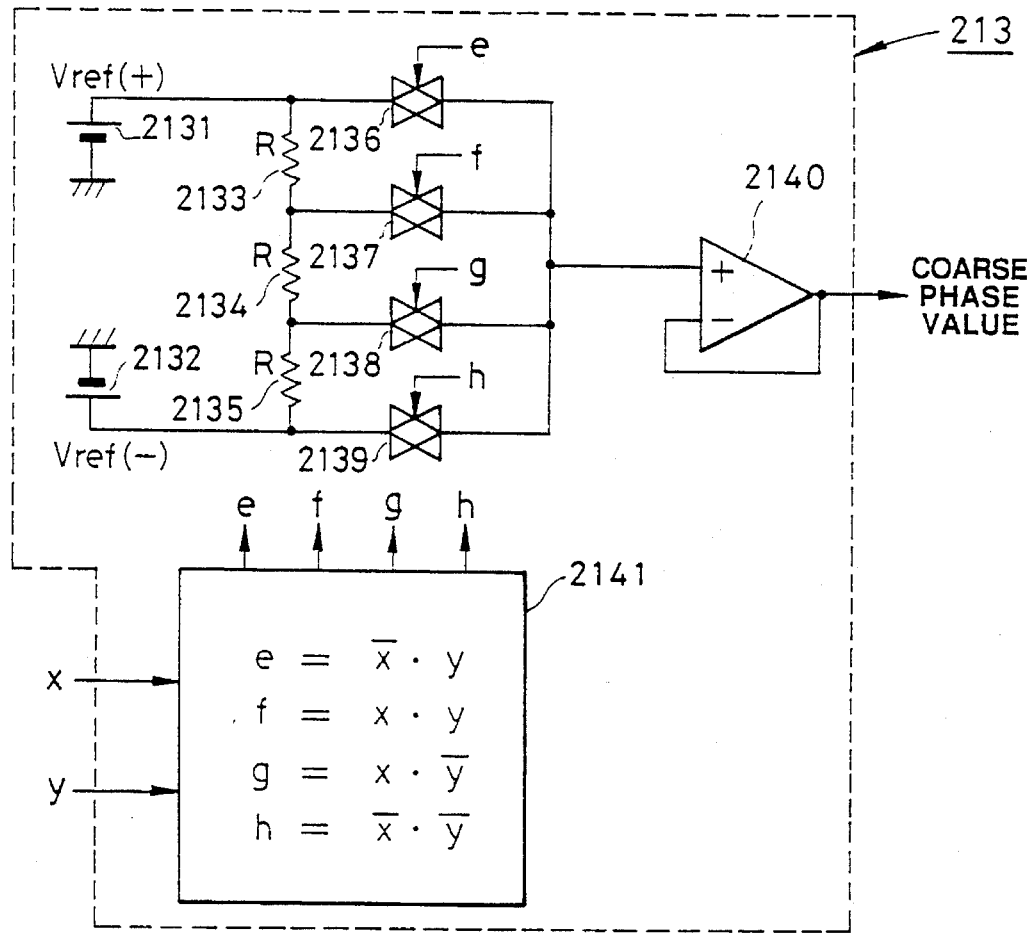
FIG. 12 illustrates a configuration of a coarse phase generation circuit in the phase detector of FIG. 9.

The coarse phase generation circuit 213 may have such a structure as shown in FIG. 12, in which a logic arithmetic block 2141 receives and calculates the inputs x and y from the positive/negative judgment circuits 211 and 212, and outputs coarse phase values corresponding to the inputs x and y. FIG. 12 shows the structure when the coarse phase values are output in an analog form. When the input complex baseband signal is located within the first quadrant, a signal f is used to drive a switch 2137, whereby the coarse phase generation circuit 213 outputs a voltage which follows.

$$2(Vref(+)-Vref(-))/3$$

Similarly, when the input complex baseband signal is located within the second quadrant, a signal e is used to drive a switch 2136, whereby the coarse phase generation circuit 213 outputs a voltage Vref(+). When the input complex baseband signal is within the third quadrant, a signal h is used to drive a switch 2139, whereby the coarse phase generation circuit 213 outputs a voltage Vref(-). Further, when the input complex baseband signal is located within the fourth quadrant, a signal g is used to drive a switch 2138, whereby the coarse phase generation circuit 213 outputs a voltage which follows.

$$(Vref(+)-Vref(-))/3$$

In the illustrated example, these output voltages correspond to the coarse phase values of $\pi/4$, $3\pi/4$, $-\pi/4$ and $-3\pi/4$, respectively.

Figure 13:
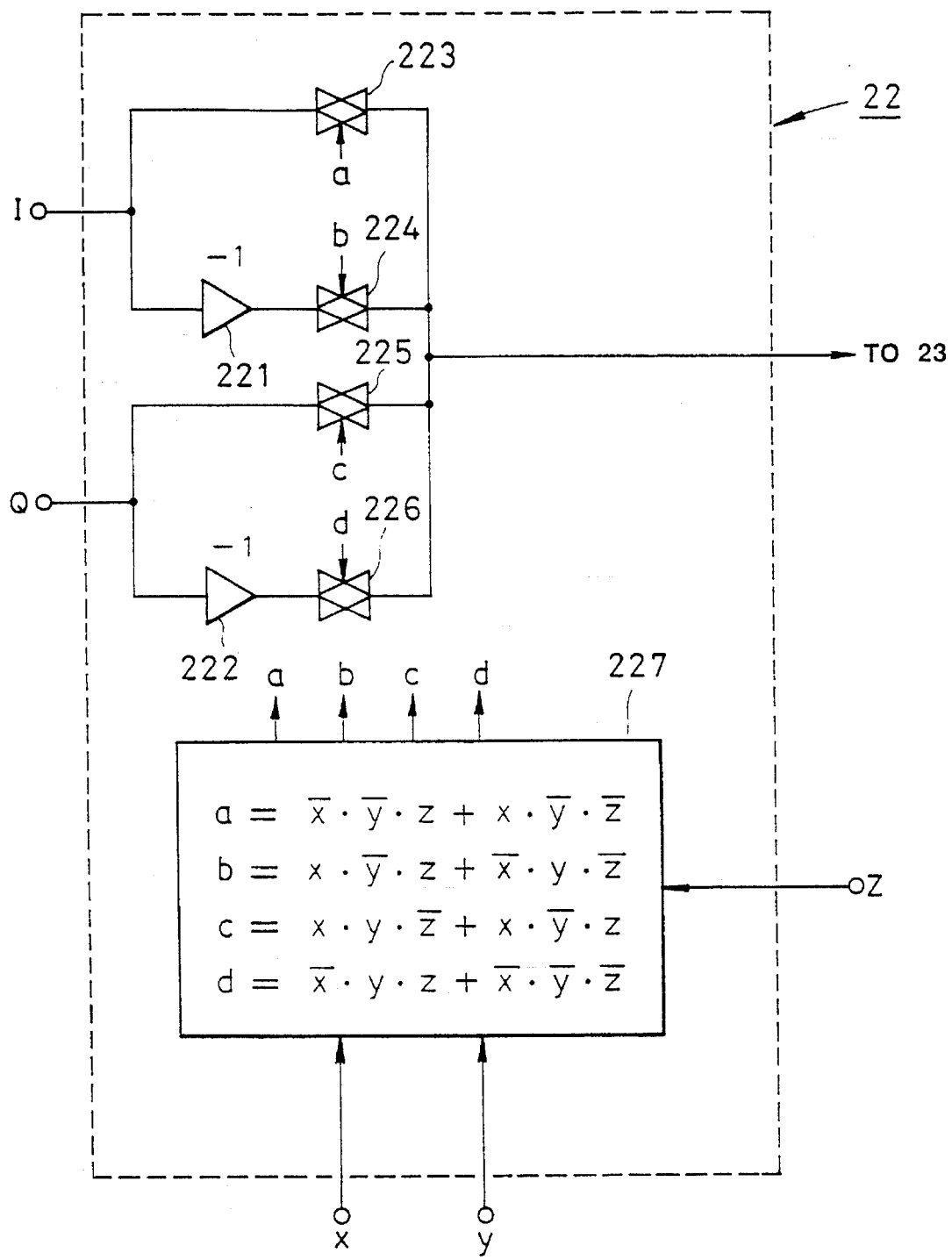
FIG. 13 illustrates a configuration of a rotation projection circuit in the phase detector of FIG. 9.

Referring next to FIG. 13, there is shown an example of the rotation projection circuit 22. In the rotation projection circuit 22, the input complex baseband signal components I and Q are divided respectively into two, one of which is used to generate signals $-I$ and $-Q$ through inverters 221 and 222 and the other of which is used to generates signal components I and Q. The 4 signals I, $-I$, Q and $-Q$ are selected by selection control signals a, b, c and d of switches 223, 224, 225 and 226 respectively. The selected signal is output to the integration circuit 23. The selection control signals a, b, c and d are generated according to the illustrated logic operations on the basis of the outputs x and y and an output z of the delay circuit 25.

Explanation will now be made as to the principle of operation in the rotation projection circuit 22. The rotation projection circuit 22 first applies phase rotations of $-\pi/4$ and $+\pi/4$ to the input complex baseband signal components I and Q depending on the output z "1" or "0" of the delay circuit 25. That is:

($\alpha$) When the output z of the delay circuit 25 is 1, the rotation projection circuit 22 applies a phase rotation which follows.

$$(I + jQ)\{\cos(\pi/4) - j\sin(\pi/4)\} =$$

$$(1/\sqrt{2})\{(I+Q)+j(-I+Q)\}$$

Accordingly, signals after subjected to the phase rotation are:

$$\{(1/\sqrt{2})(I+Q); (1/\sqrt{2})(-I+Q)\}$$

($\beta$) When the output z of the delay circuit 25 is 0, the rotation projection circuit 22 applies a phase rotation which follows.

$$(I + jQ)\{\cos(\pi/4) + j\sin(\pi/4)\} =$$

$$(1/\sqrt{2})\{(I+Q)+j(I+Q)\}$$

Accordingly, signals after subjected to the phase rotation are:

$$\{(1/\sqrt{2})(I-Q); (1/\sqrt{2})(I+Q)\}$$

Next, these signals are projected on the straight line which is perpendicular to the center axis bisecting the phase region detected by the phase region detection circuit 21, which has its intersection point set as an origin, and which is positive in the direction of increasing the phase of the phase region. The concept of the projection line, in particular, an example of the first quadrant is shown in FIG. 10(b).

More particularly, referring to FIG. 10(b), (A) when the outputs x and y of the phase region detection circuit 21 are both "1", that is, when the outputs are located within the first quadrant, a unit vector on a straight line (p2) which is perpendicular to a center axis (p1) bisecting the phase region of interest (first quadrant), which has an origin at its intersection point and whose positive direction corresponds to the phase increasing direction in the phase region, is $(-1/\sqrt{2}, 1/\sqrt{2})$. Accordingly, the line projection is expressed by an inner product with respect to the unit vector. Accordingly, ($\alpha$1) when z=1, $$\{(1/\sqrt{2})(I+Q), (1/\sqrt{2})(-I+Q)\}$$

$$(-1/\sqrt{2}, 1/\sqrt{2}) = -I$$

($\beta$1) when z=0, $$\{(1/\sqrt{2})(I-Q), (1/\sqrt{2})(I+Q)\}$$

$$(-1/\sqrt{2}, 1/\sqrt{2}) = Q$$

Similarly, (B) when the outputs x and y of the phase region detection circuit 21 are "0" and "1" respectively, that is, when the outputs are located within the second quadrant, a unit vector on a straight line which is perpendicular to a center axis bisecting the phase region of interest, which has an origin at its intersection point and whose positive direction corresponds to the phase increasing direction in the phase region, is $(-1/\sqrt{2}, -1/\sqrt{2})$. Accordingly, ($\alpha$2) when z=1, $$\{(1/\sqrt{2})(I+Q), (1/\sqrt{2})(-I+Q)\}$$

$$(-1/\sqrt{2}, -1/\sqrt{2}) = -Q$$

(β2) when z=0, $$\{(1/\sqrt{2})(I-Q), (1/\sqrt{2})(I+Q)\}$$

$$(-1/\sqrt{2}, -1/\sqrt{2}) = -I$$

(C) when the outputs x and y of the phase region detection circuit 21 are both "0", that is, when the outputs are located within the third quadrant, a unit vector on a straight line which is perpendicular to a center axis bisecting the phase region of interest, which has an origin at its intersection point and whose positive direction corresponds to the phase increasing direction in the phase region in question, is (1/√2, −1/√2). Accordingly, (α3) when z=1, $$\{(1/\sqrt{2})(I+Q), (1/\sqrt{2})(-I+Q)\}$$

$$(1/\sqrt{2}, -1/\sqrt{2}) = I$$

(β3) when z=0, $$\{(1/\sqrt{2})(I-Q), (1/\sqrt{2})(-I+Q)\}$$

$$(1/\sqrt{2}, -1/\sqrt{2}) = -Q$$

Similarly, (D) when the outputs x and y of the phase region detection circuit 21 are "1" and "0" respectively, that is, when the outputs are located within the fourth quadrant, a unit vector on a straight line which is perpendicular to a center axis bisecting the phase region of interest, which has an origin at its intersection point as an origin and whose positive direction corresponds to the phase increasing direction in the phase region in question, is (1/√2, 1/√2). Accordingly, (α4) when z=1, $$\{(1/\sqrt{2})(I+Q), (1/\sqrt{2})(-I+Q)\}$$

$$(-1/\sqrt{2}, 1/\sqrt{2}) = Q$$

(β4) when z=0, $$\{(1/\sqrt{2})(I-Q), (1/\sqrt{2})(I+Q)\}$$

$$(1/\sqrt{2}, 1/\sqrt{2}) = I$$

From the above explanation, it is understood that the operation of the rotation projection circuit 22 results in selection of the signals I, −I, Q and −Q based on the signal a to d calculated and output according to logic operation expressions given in the logical operation block 227 in FIG. 13.

The integration circuit 23, quantization circuit 24 and delay circuit 25 provided in the post-stage of the rotation projection circuit 22 are substantially the same in operation as a known Δ–Σ modulator, and thus the explanation thereof is omitted.

Figure 14:
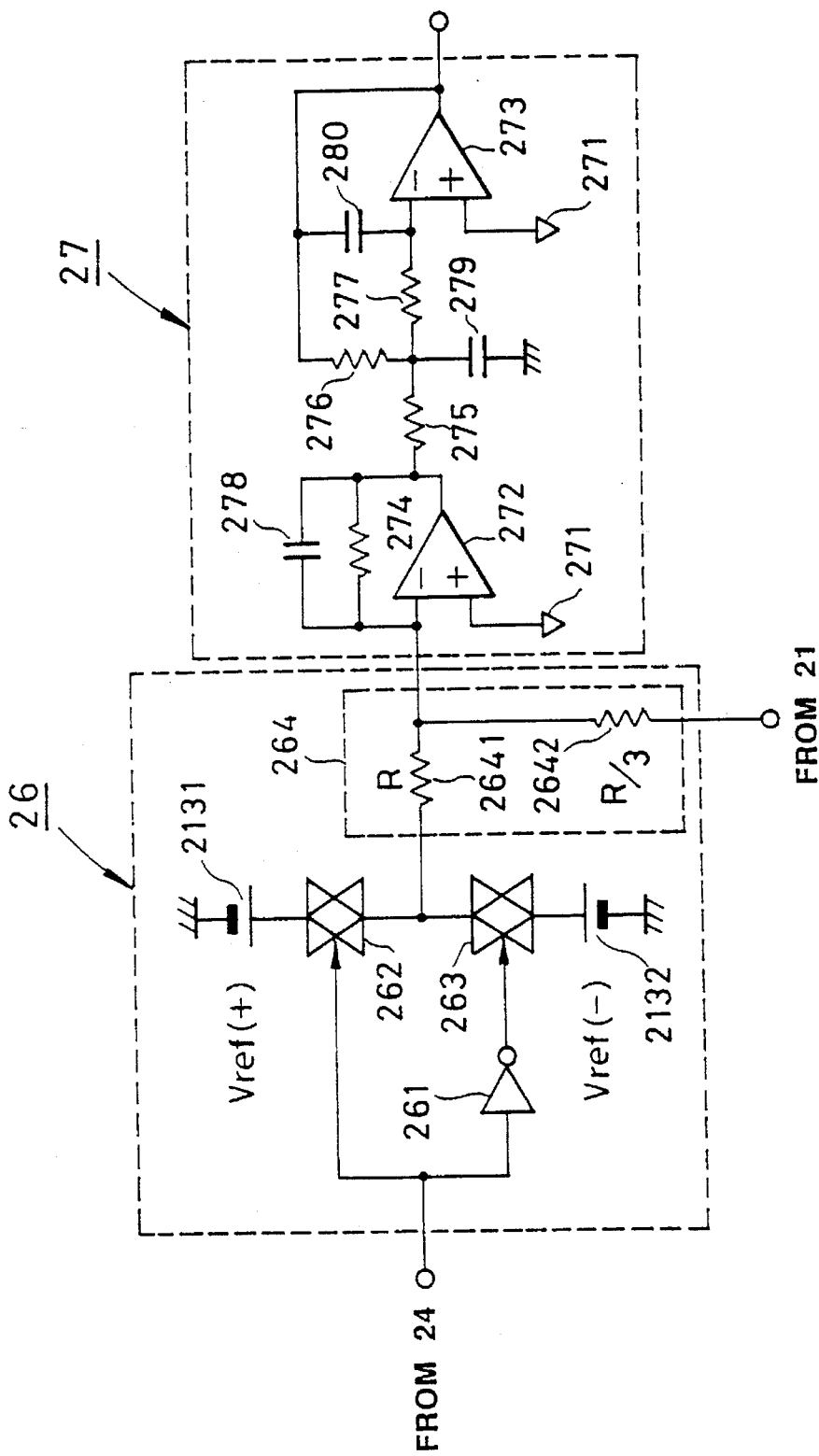
FIG. 14 illustrates configurations of a phase synthesizing circuit and a filter in the phase detector of FIG. 9.
Figure 15:
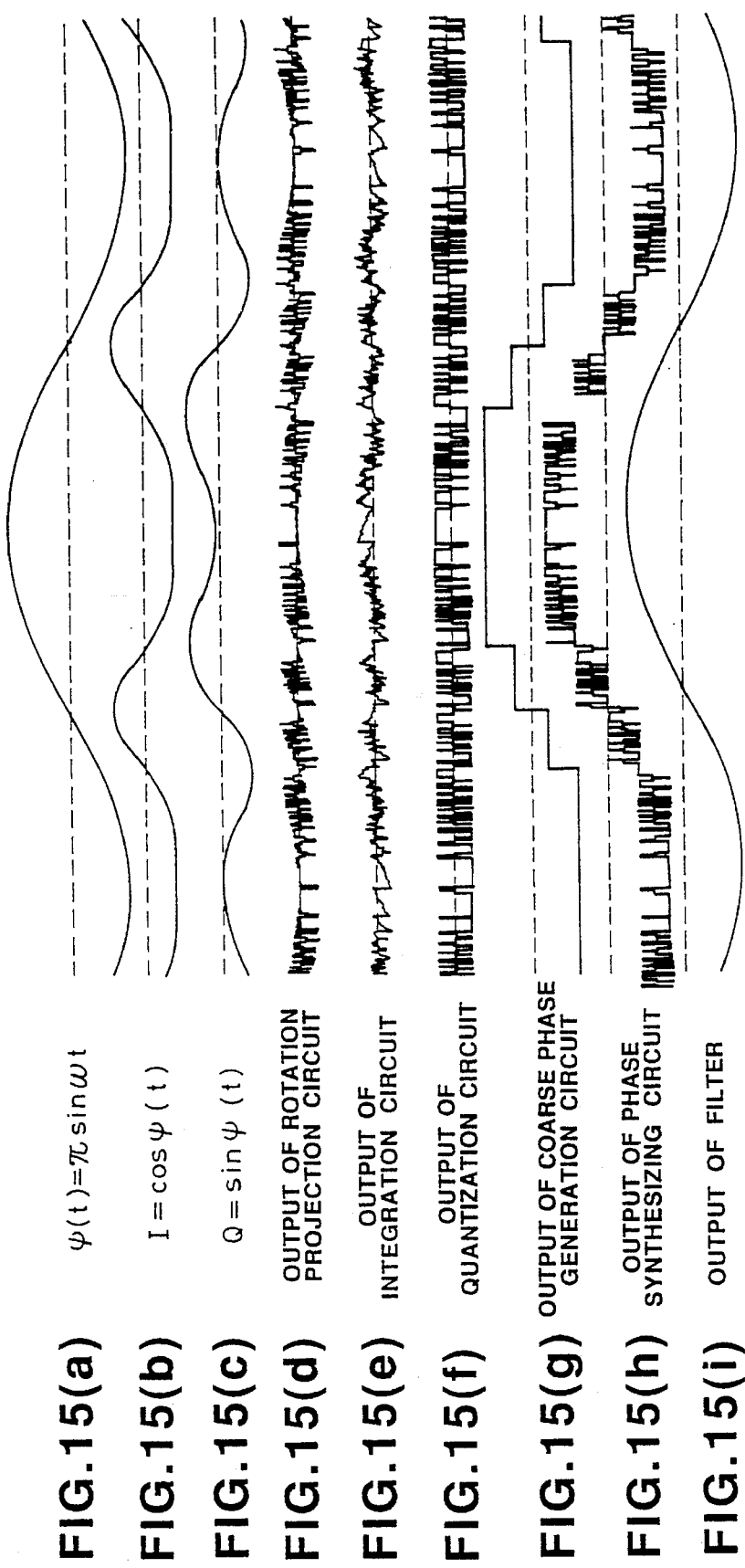
FIG. 15(a), 15(b), 15(c), 15(d), 15(e), 15(f), 15(g), 15(h), and 15(i), illustrate waveforms of signals appearing at various points in the detecting operation of the phase detector of FIG. 9.

The phase synthesizing circuit 26 and the filter 27, when their output signals are desired to have analog values for example, may be implemented by such a structure as shown in FIG. 14. More specifically, the phase synthesizing circuit 26 selects the signal Vref(+) when receiving the output of "1" from the quantization circuit 24, while the phase synthesizing circuit 26 selects the signal Vref(−) when receiving the output of "0" therefrom. At this time, the voltage Vref(+) expresses +π/4 and the voltage Vref(−1) expresses −π/4.

The output voltage is added at an adder 264 to the output voltage of the coarse phase generation circuit 213. In the illustrated example, a synthesizing ratio of the output voltage to the coarse phase voltage is set to be 1:3 (which can be realized by setting the ratio in resistance between addition resistors 2641 and 2642 to be 1:3 as illustrated), whereby the corresponding phase magnitudes are coincided with each other. Quantization noise in the addition output of the phase synthesizing circuit 26 is removed at the filter (low-pass filter) 27 and final phase information is output.

FIG. 14 shows computer simulation results of waveforms of signals appearing at various points in the above second embodiment system. In the drawing, (a) denotes a phase signal φ(t), (b) and (c) denote the components I and Q of the input complex baseband signal, (d) denotes the waveform of the output of the rotation projection circuit 22, (e) denotes the waveform of the output of the integration circuit 23, (f) denotes the waveform of the output of the quantization circuit 24, (g) denotes the waveform of the output of the coarse phase generation circuit 213, (h) denotes the waveform of the output of the phase synthesizing circuit 26, and (i) denotes the waveform of the output of the filter 27. As seen from the signal (i), the waveform output of the filter 27 as the final reproduced signal corresponds well to the original signal φ(t).

Figure 16:
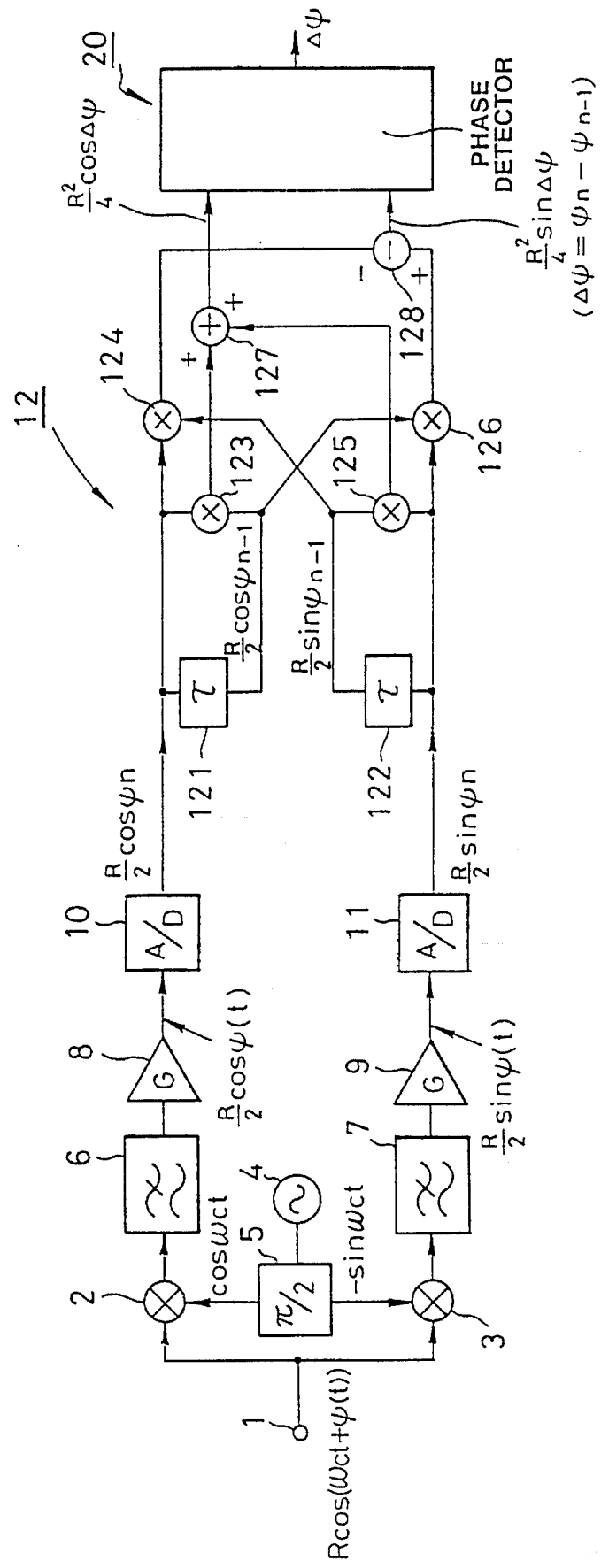
FIG. 16 illustrates an arrangement of an FM receiver to which the phase detector shown in FIG. 9 is supplied.
Figure 17:
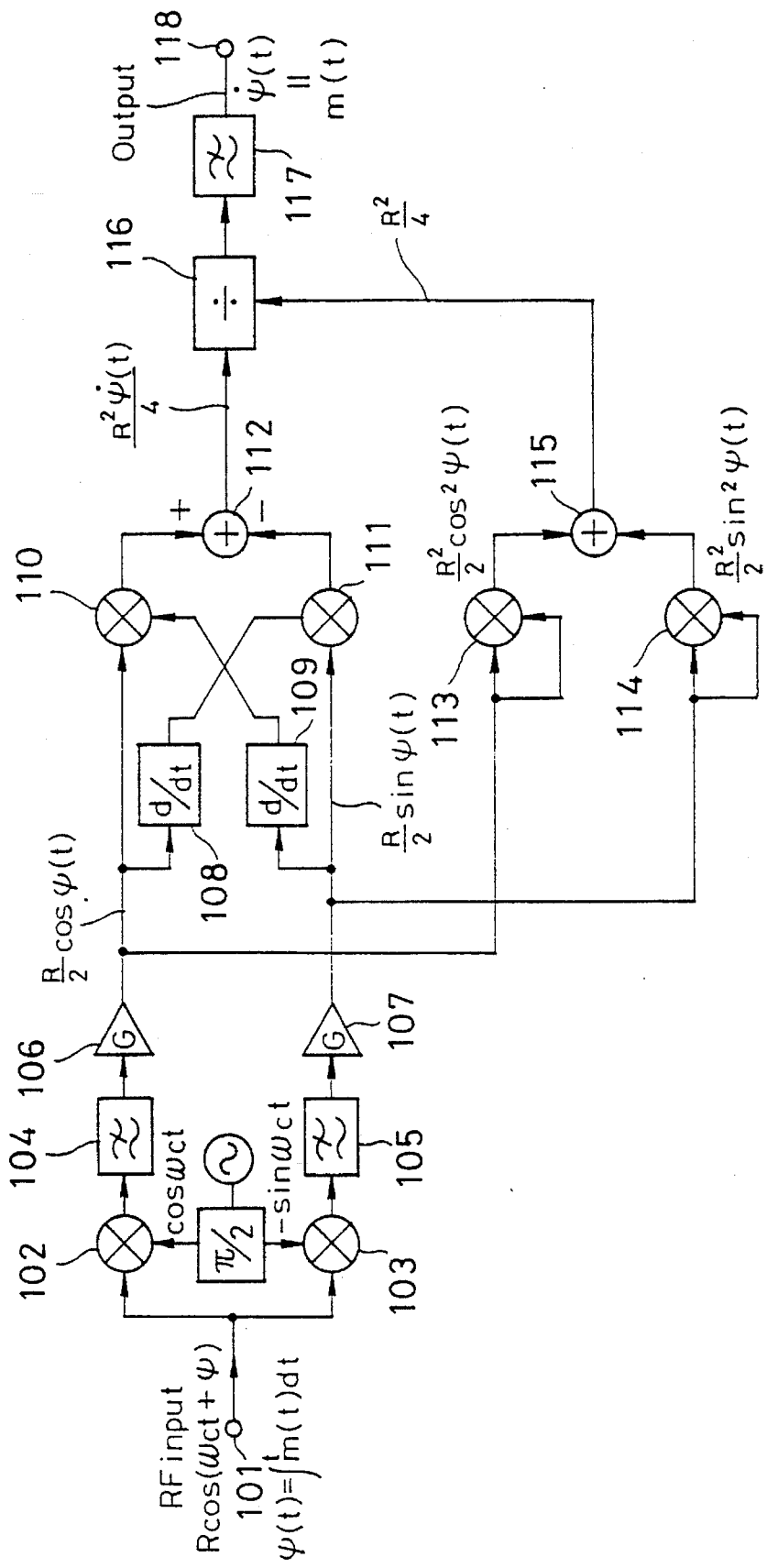
FIG. 17 illustrates an arrangement of a prior art FM receiver.

Shown in FIG. 16 is an exemplary arrangement of an FM receiver which uses a phase detector in accordance with a second embodiment of the present invention. This FM receiver is considered to correspond to the FM receiver of FIG. 1 but the phase detector 20 of FIG. 9 based on the Σ–Δ modulation is connected to the post-stage of the second complex baseband signal generation circuit 12.

In the FM receiver, a received FM signal Rcos(ωc t+φ(t)) (where (φ(t))'=m(t) and m(t) denotes an original modulation signal) is subjected orthogonal demodulation through the mixers 2, 3, low-pass filters 6, 7 and amplifiers 8, 9 with use of a first orthogonal local signal having a frequency equal to its center frequency to obtain first complex baseband signal (R/2)cosφ(t) and (R/2) sin φ(t).

Next, in the second complex baseband signal generation circuit 12; τ delay circuits 121, 122, multipliers 123 to 126, an adder 127 and a subtractor 128 are used to generate second complex baseband signal, $(R^2/4)$ cosΔφ and $(R^2/4)$ sinΔφ which include cosine and sine components of phase change Δφ in the first complex baseband signal in a time interval τ.

Further, the second complex baseband signal is supplied to the phase detector 20 based on the above Σ–Δ modulation. More specifically, the phase detector 20 performs such processing as explained in connection with the second example, extracts a signal Δφ from the input complex baseband signal (above second complex baseband signal), and outputs the signal Δφ, whereby Δφ/τ≈{φ(t))}'=m(t) is obtained from the phase change Δφ at the time interval τ and FM detection is carried out.

It goes without saying that the present invention may be modified and supplied in various ways so long as it does not depart from the principle or gist of the present invention.

What is claimed is:

1. A method of detecting an instantaneous phase in a complex baseband signal, comprising the steps of:

performing phase rotation to the baseband signal;

generating rotation-angle data indicative of a rotation angle of the baseband signal and holding the rotation-angle until it is renewed;

rotating the phase of the baseband signal so as to equalize with phase of the baseband signal to be obtained;

sampling and holding the rotation-angle data each time the equalization with the phase of the baseband signal to be obtained is performed; and outputting the rotation,angle data thus sampled and held as a detection signal.

2. The method as set forth in claim 1, further comprising the step of filtering the detection signal by a low pass filter after the detection signal is output.

3. A phase detector for detecting an instantaneous phase in a complex baseband signal, comprising:

phase rotation means for rotating a phase of the baseband signal;

rotation-angle data generation means for generating rotation-angle data indicative of the phase angle to be rotated in the baseband signal and for holding the rotation-angle data until it is renewed; and phase/rotation-angle equalization means for rotating the phase of the baseband signal so as to equalize with phase of the baseband signal to be obtained, wherein an output of the rotation-angle data generation means indicative of a rotation angle made equal by the phase/rotation-angle equalization means is output as a detection signal.

4. The phase detector as set forth in claim 3, wherein the output of the rotation-angle data generation means is again sampled and held each time the equalization by the rotation-angle equalization means is carried out.

5. The phase detector as set forth in claim 3, further comprising a low-pass filter provided at a stage subsequent to the rotation-angle data generation means, for filtering the detection output.

6. A method of detecting an instantaneous phase in a complex baseband signal, comprising the steps of:

rotating the phase of the baseband signal;

generating rotation-angle data indicative of a rotation angle of the baseband signal and holding the rotation-angle data until it is renewed;

rotating the phase of the baseband signal so as to equalize the phase of the baseband signal with a desired phase of the baseband signal; and, outputting the rotation-angle data indicative of the rotation angle used to achieve desired phase.

7. A phase detector for detecting an instantaneous phase in a complex baseband signal, comprising:

phase rotation means for rotating a phase of the baseband signal;

rotation-angle data generation means for generating rotation-angle data indicative of the phase angle to be rotated in the baseband signal and for holding the rotation-angle data until it is renewed, said rotation-angle data generating means includes an output outputting a detection signal; and, phase/rotation-angle equalization means for rotating the phase of the baseband signal so as to equalize the phase of the baseband signal with a desired phase of the baseband signal, and for outputting a rotation angle, wherein said detection signal indicates said rotation angle used by the phase/rotation-angle equalization means to achieve the desired phase.

8. An FM receiver in which an FM signal is subjected to orthogonal demodulation with use of a orthogonal local signal having a frequency equal to a center frequency of the FM signal to obtain a demodulated first complex baseband signal so as to detect an original modulation signal with use of the demodulated first complex baseband signal, the FM receiver comprising:

second complex baseband signal generation means for generating a second complex baseband signal having cosine and sine components of a phase change of the first complex baseband signal in a predetermined time interval $\tau$;

phase rotation means for rotating a phase of the second complex baseband signal;

rotation-angle data generation means for generating data indicative of the phase angle to be rotated; and phase/rotation-angle equalization means for equalizing a rotation angle of the rotated second complex baseband signal to the phase change of the first complex baseband signal during the time interval $\tau$, wherein an output of the rotation-angle data generation means indicative of the rotation angle equalized by the phase/rotation-angle equalization means is taken as a detection output.

9. The FM receiver as set forth in claim 8, further comprising, a low-pass filter provided a stage subsequent to the rotation-angle data generation means, for filtering the detection output.

10. The FM receiver as set forth in claim 8, wherein the output of the rotation-angle data generation means is held until a value of the output is renewed.

11. The FM receiver as set forth in claim 10, wherein the output of the rotation-angle data generation means is again sampled and held with the time interval $\tau$.

12. An FM receiver in which an FM signal is subjected to orthogonal demodulation with use of a orthogonal local signal having a frequency equal to a center frequency of the FM signal to obtain a demodulated first complex baseband signal so as to detect an original modulation signal with use of the demodulated first complex baseband signal, the FM receiver comprising:

second complex baseband signal generation means for generating a second complex baseband signal having cosine and sine components of a phase change of the first complex baseband signal in a predetermined time interval $\tau$;

phase region detection means for detecting one of a plurality of phase regions formed by equally dividing a complex coordinate plane by $2\pi/N$ radian (N being an integer of 4 or more) to which a phase of the second complex baseband signal belongs and outputting a detected result as a coarse phase value;

rotation projection means for rotating the phase of the baseband signal by $+\pi/N$ or $-\pi/N$ radian according to a designation signal having a value of 1 or 0 indicative of an increase or decrease tendency in the phase of the baseband signal and outputting a value obtained by projecting the phase-rotated baseband signal onto a straight line which is perpendicular to a center axis bisecting the detected phase region and which has an origin at its intersection point whose positive direction corresponds to phase increasing direction in the detected phase region;

integration means for integrating an output of the rotation projection means;

quantization means for converting an output of the integration means to 1-bit binary value;

delay means for delaying an output of the quantization means to obtain a delayed signal and outputting the delayed signal as the designation signal;

phase synthesizing means for synthesizing the coarse phase value output of the phase region detection means with the output of the quantization means; and filter means for filtering an output of the phase synthesizing means, wherein the phase of the baseband signal is detected utilizing $\Sigma\text{-}\Delta$ modulation.

13. The FM receiver as set forth in claim 12, wherein the integer N is 4 so that the complex coordinate plane is divided into four quadrants in a complex coordinate system by axes I and Q corresponding to phase components I and Q of the baseband signal, and the output of the rotation projection means is determined according to which quadrant the baseband signal belongs to and value of the 1-bit binary value transmitted with delay as follows:

(A) When the baseband signal is in the first quadrant, the output is Q when the 1-bit binary value is "0", and −I when the output of the delay step is "1";

(B) When the baseband signal is in the second quadrant, the output is −I when the 1-bit binary value is "0", and −Q when the 1-bit binary value is "1";

(C) When the baseband signal is in the third quadrant, the output is −Q when the 1-bit binary value is "0", and I when the 1-bit binary value is "1";

(D) When the baseband signal is in the fourth quadrant, the output is I when the 1-bit binary value is "0", and Q when the 1-bit binary value is "1".

* * * * *